United States Patent
Lee et al.

(10) Patent No.: US 6,833,700 B2
(45) Date of Patent: Dec. 21, 2004

(54) METHOD AND APPARATUS FOR RECONSTRUCTION OF IMAGES IN PARALLEL MRI SYSTEMS

(75) Inventors: Ray Fli Lee, Niskayuna, NY (US); Christopher Judson Hardy, Schenectady, NY (US)

(73) Assignee: General Electric Company, Niskayuna, NY (US)

(*) Notice: Subject to any disclaimer, the term of this patent is extended or adjusted under 35 U.S.C. 154(b) by 25 days.

(21) Appl. No.: 10/065,044

(22) Filed: Sep. 13, 2002

(65) Prior Publication Data

US 2004/0051526 A1 Mar. 18, 2004

(51) Int. Cl.[7] ............................................. G01V 3/00
(52) U.S. Cl. ............................................. 324/307
(58) Field of Search ........................... 324/307, 309, 324/318, 300; 600/410

(56) References Cited

U.S. PATENT DOCUMENTS

| | | | |
|---|---|---|---|
| 5,653,233 A | * 8/1997 | Pelc et al. ................... 600/410 |
| 5,808,467 A | * 9/1998 | Ochi et al. ................... 324/309 |
| 5,910,728 A | 6/1999 | Sodickson ................... 324/309 |
| 6,289,232 B1 | * 9/2001 | Jakob et al. ................. 600/410 |
| 6,326,786 B1 | * 12/2001 | Pruessmann et al. ....... 324/312 |
| 6,366,092 B1 | * 4/2002 | Ehnholm et al. ............ 324/309 |
| 6,396,269 B1 | * 5/2002 | Hajnal et al. ................ 324/307 |
| 6,476,606 B2 | * 11/2002 | Lee ............................. 324/309 |
| 6,483,308 B1 | * 11/2002 | Ma et al. ..................... 324/312 |
| 6,492,814 B1 | * 12/2002 | Watkins et al. ............. 324/318 |
| 6,559,642 B2 | * 5/2003 | King ........................... 324/307 |
| 6,653,834 B2 | * 11/2003 | Beck et al. .................. 324/309 |

* cited by examiner

*Primary Examiner*—Diego Gutierrez
*Assistant Examiner*—Dixomara Vargas
(74) *Attorney, Agent, or Firm*—Jean K. Testa; Patrick K. Patnode

(57) ABSTRACT

A parallel Magnetic Resonance Imaging (MRI) system is provided for reconstructing images, to enable accelerated MRI with minimal artifacts. The MRI system comprises an array of magnetic resonance (MR) coils arranged in an array for detecting a plurality of MR signals, each coil having a corresponding spatial sensitivity profile and a processing means for processing the plurality of MR signals with at least one filter bank to reconstruct at least one image.

19 Claims, 5 Drawing Sheets

METHOD AND APPARATUS FOR RECONSTRUCTION OF IMAGES IN PARALLEL MRI SYSTEMS

BACKGROUND OF INVENTION

The invention relates generally to Magnetic Resonance Imaging (MRI) systems and more specifically to a method and apparatus for reconstructing images in parallel MRI systems.

Generally, MRI is a well-known imaging technique. A conventional MRI device establishes a homogenous magnetic field, for example, along an axis of a person's body that is to undergo MRI. This homogeneous magnetic field conditions the interior of the person's body for imaging by aligning the nuclear spins (in atoms and molecules forming the body tissue) along the axis of the magnetic field. If the orientation of the nuclear spins is perturbed out of alignment with the magnetic field, the nuclei attempt to realign their spins with the axis of the magnetic field. Perturbation of the orientation of nuclear spins may be caused by application of radio frequency (RF) pulses tuned to the Larmor frequency. During the realignment process, the nuclei precess about the axis of the magnetic field and emit electromagnetic signals that may be detected by one or more RF detector coils placed on or about the person.

The frequency of the magnetic resonance (MR) signal emitted by a given precessing nucleus depends on the strength of the magnetic field at the nucleus' location. As is well known in the art, it is possible to distinguish signals originating from different locations within the person's body by applying a gradient to the magnetic field across the person's body. For the sake of convenience, direction of this field gradient may be referred to as the left-to-right direction. Signals of a particular frequency acquired during application of the field gradient may be assumed to originate at a given position within the field gradient, and hence at a given left-to-right position within the person's body. The application of such a field gradient is also referred to as frequency encoding.

However, the application of a field gradient does not allow for two-dimensional spatial encoding, since all nuclei at a given left-to-right position experience the same field strength, and hence emit signals of the same frequency. Accordingly, the application of a frequency-encoding gradient, by itself, does not make it possible to discern signals originating from the top versus signals originating from the bottom of the person at a given left-to-right position. Spatial encoding has been found to be possible in this second direction by application of gradients of varied strength in a perpendicular direction prior to acquisition of the signal, to thereby twist the phase of the nuclear spins by varied amounts. The application of such additional gradients is referred to as phase encoding.

Frequency-encoded data sensed by the RF detector coils after a phase encoding step is stored as a line of data in a data matrix known as the k-space matrix. Multiple phase encoding steps are performed in order to fill the multiple lines of the k-space matrix. An image may be generated from this matrix by performing a two-dimensional Fourier transformation of the matrix to convert this frequency information to spatial information representing the distribution of nuclear spins or density of nuclei of the image material.

Alternatively, spatial encoding can be performed in three dimensions by applying phase-encoding gradients in two orthogonal directions, followed by a frequency-encoding gradient in the third orthogonal direction, with signals acquired during the frequency-encoding gradient, in order to generate a three-dimensional matrix of k-space data. Three-dimensional Fourier transformation of the matrix will then convert this frequency information to spatial information representing the distribution of nuclear spins or density of nuclei within a volume of the image material.

Imaging time is largely a function of desired signal-to-noise ratio (SNR) and the speed with which the MRI device can fill the k-space matrix. In conventional MRI, the k-space matrix is filled one line at a time. Although many improvements have been made in this general area, the speed with which the k-space matrix may be filled is limited. To overcome these inherent limits, several techniques have been developed to effectively simultaneously acquire multiple lines of data for each application of a magnetic field gradient. These techniques, which may collectively be characterized as "parallel imaging techniques", use spatial information from arrays of RF detector coils to substitute for the encoding which would otherwise have to be obtained in a sequential fashion using field gradients alone. The use of multiple detectors has been shown to multiply imaging speed, without increasing gradient switching rates or RF power deposition. Parallel imaging techniques fall into one of two categories. They can fill in the omitted k-space lines prior to Fourier transformation, by constructing a weighted combination of neighboring lines acquired by the different RF detector coils. Or, they can first Fourier transform the limited k-space data to produce an aliased image from each coil, and then unfold the aliased signals by a linear transformation of the superimposed pixel values. In either case, the reconstructed images tend to suffer from incomplete removal of aliasing artifacts, especially for large speedup factors. In images corrupted by aliasing, the edges of the image are wrapped into the center of the image.

Another problem in the reconstruction of the image is degraded signal-to-noise ratio (SNR) in some regions of the image. One reason for both of the above effects is the overlapping of the sensitivity profiles of the coils in the array. Insufficiently distinct sensitivity profiles can lead to both residual aliasing and degraded regional SNR. One way to overcome the above problems is to keep the sensitivity profile of each coil orthogonal to all of the others.

It is therefore desirable to reconstruct an artifact-free image, by reducing the effects of aliasing and degraded SNR.

SUMMARY OF INVENTION

Briefly, in accordance with one embodiment of the invention, a reconstruction method for use in a parallel MRI system is provided. The MRI system comprises a plurality of MR detector coils arranged in an array and each coil has a corresponding spatial sensitivity profile. The method comprises detecting a plurality of MR signals from the plurality of MR coils and processing the detected MR signals with at least one filter bank to reconstruct at least one image.

In an alternate embodiment, a parallel Magnetic Resonance Imaging (MRI) system is provided for reconstruction of images. The MRI system comprises an array of magnetic resonance (MR) detector coils arranged in an array for detecting a plurality of MR signals, each of the coils having a corresponding spatial sensitivity profile and a processing means for processing the plurality of MR signals with at least one filter bank to reconstruct at least one image.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
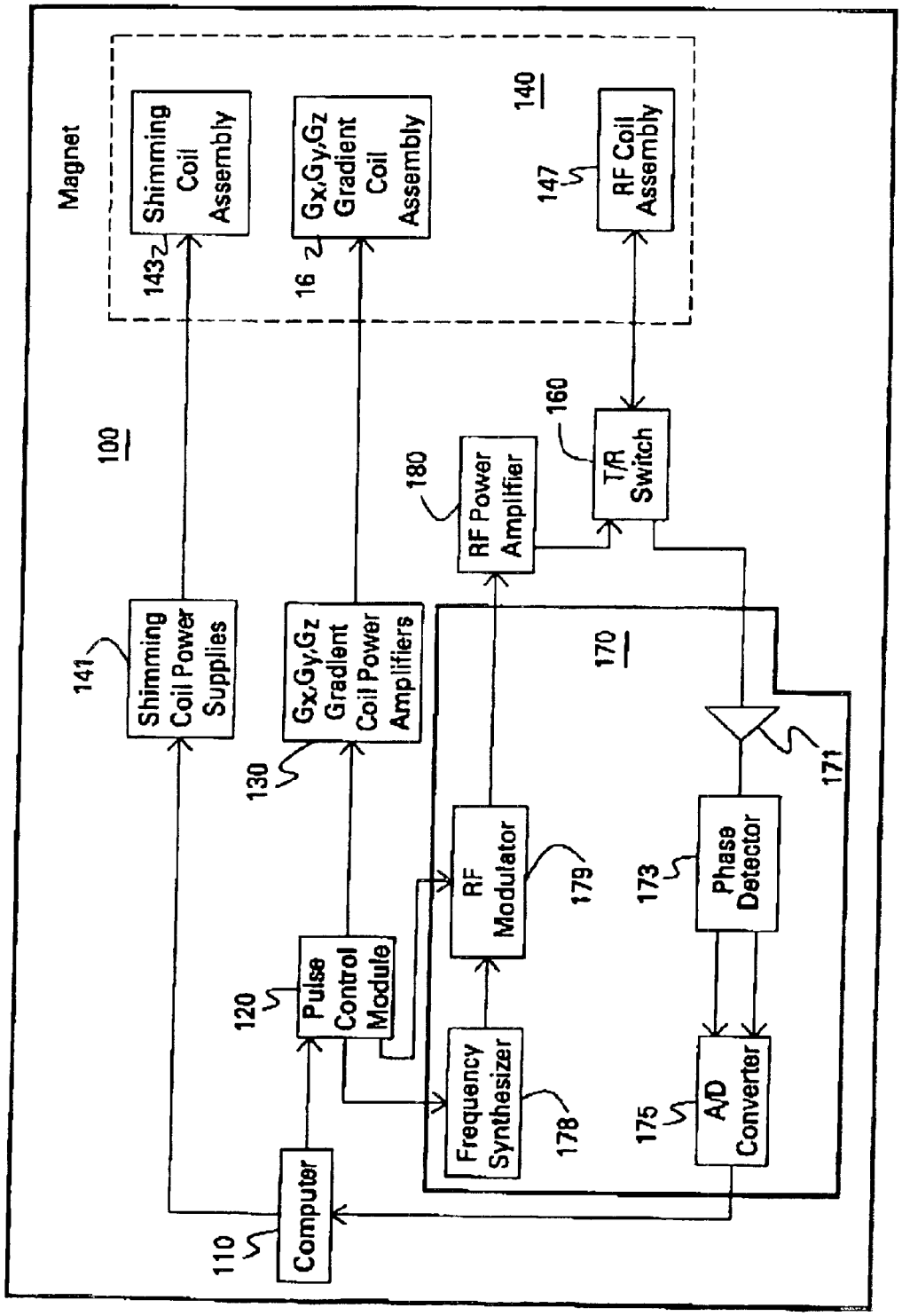
FIG. 1 is a schematic block diagram of an exemplary MR imaging system suitable for use with the present invention embodiments.

FIG. 1 is an example embodiment of a magnetic resonance (MR) imaging system 100. MRI system 100 includes a computer 110, which controls gradient coil power amplifiers 130 through a pulse control module 120. The pulse control module 120 and the gradient amplifiers 130 together produce the proper gradient waveforms Gx, Cy, and Gz, for either a spin echo, a gradient recalled echo pulse sequence, a fast spin echo, or other type of pulse sequences. The gradient waveforms are connected to gradient coils 16, which are positioned around the bore of an MR magnet assembly 130 so that gradients Gx, Gy, and Gz are impressed along their respective axes on the polarizing magnetic field $B_0$ from magnet assembly 140.

The pulse control module 120 also controls a radio frequency synthesizer 178 that is part of RF transceiver system 170, portions of which are enclosed by dashed line block. The pulse control module 120 also controls an RF modulator 179, which modulates the output of the radio frequency synthesizer 178. The resultant RF signals, amplified by RF power amplifier 180 and applied to a RF coil assembly 147 through transmit/receive switch 160, are used to excite the nuclear spins of the imaged object (not shown).

In embodiments of the present invention, RF coil assembly 147 is a RF detector array consisting of multiple detector elements, such as loops or conductive strips and may also be configured as an array of multiple coils or conductive strips. Other conductive materials and structures, for example copper rods, pipes, wires or other similar line structures, may also be used as detector elements. In a further embodiment, RF coil assembly 147 is an MRI phased array. In an embodiment, the detector elements may be non-overlapping or overlapping.

The MR signals from the excited nuclei of the imaged object are picked up by RF coil assembly 147 and presented to preamplifier 171 through transmit/receive switch 160, to be amplified and then processed by a quadrature phase detector 173. The detected signals are digitized by a high speed A/D converter 175 and applied to computer 110 for processing to produce MR images of the object. Computer 110 also controls shimming coil power supplies 141 to power shimming coil assembly 143. The manner in which computer 110 processes the detected signal to reconstruct an image is described in further detail below.

Figure 2:
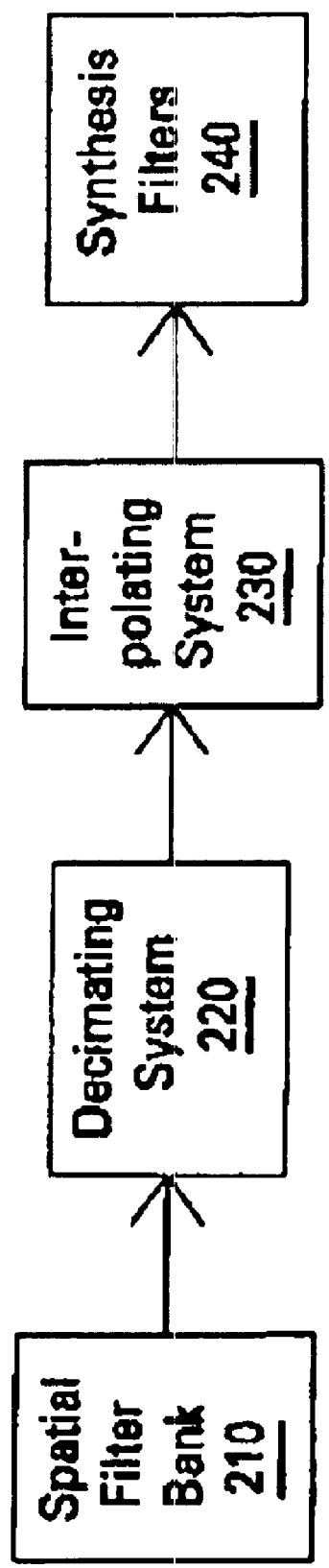
FIG. 2 is a block diagram illustrating a method for reconstructing images by a MRI system.

FIG. 2 is a block diagram illustrating a method for reconstructing images by an MRI system. FIG. 2 is shown comprising spatial filter bank 210, decimated gradient phase encoding 220, interpolating system 230 and synthesis filter bank 240. Each component is described in further detail below. It is to be noted that the array of RF detector coils forms the spatial filter bank.

Spatial filter bank 210 is formed with the respective sensitivity profiles for spatially filtering the plurality of detected MR signals. In an embodiment, the sensitivity profiles are represented by F(z), where F(z) equals:

$$F(z) = \begin{pmatrix} F_1(z) \\ F_2(z) \\ \vdots \\ F_N(z) \end{pmatrix} \qquad \text{Equation (1)}$$

where $F_1(z), \ldots, F_N(z)$ are the sensitivity profiles of coil 1 to coil N.

The overall detected signal S'(z) after the spatial filter bank F(z) can be $$\text{described as: } S'(z) = F(z)S(z) = \begin{pmatrix} S'_1(z) \\ S'_2(z) \\ \vdots \\ S'_N(z) \end{pmatrix} \qquad \text{Equation (2)}$$

where $S1(z), \ldots, SN(z)$ are the original signals, and $S'1(z), \ldots, S'N(z)$ are the signals after spatially filtered by sensitivity profiles of each coil. Desirably, the detector coils of the array are arranged to optimize the spatial encoding of the spatial filter bank.

Decimated gradient phase encoding 220 collects a reduced set of phase-encoded MR signals resulting in fewer lines of k-space. Interpolating system 230 interpolates the plurality of RF and gradient-encoded signals to generate a plurality of interpolated signals. Alternatively, the decimated gradient encoding comprises collecting sparse subsets of non-rectilinear trajectories in k-space, for example fewer interleaves of an interleaved spiral trajectory or fewer radial lines of a radial trajectory. The signal generated after RF and gradient encoding and interpolation is represented by:

$$S''(z) = \frac{1}{M}\sum_{m=0}^{M-1} S'(zW'') = \frac{1}{M}\sum_{m=0}^{M-1} F(zW'')S(zW'') \qquad \text{Equation (3)}$$

where M is the decimation factor (which is less than or equal to the number of coils or elements in the array), and $W = \exp(-j2\pi/M)$.

The image can be reconstructed by applying a lapped transform or filter bank to reconstruct interpolated signals of Equation (3). The description is continued first with reference to the filter bank method of reconstructing images and then with reference to the lapped-transform method.

Synthesis filter bank 240 transforms the interpolated signal to generate a corresponding image. The signal generated by synthesis filter bank 240 is represented by:

$$\hat{S}(z) = G(z)^T S''(z) = \frac{1}{M} \sum_{m=0}^{M-1} G(z)^T F(zW''') S(zW''') =$$

$$\frac{1}{M}(G_1(z) G_2(z) \ldots G_N(z)) F_0(z) \begin{pmatrix} S(z) \\ S(zW) \\ \vdots \\ S(zW^{M-1}) \end{pmatrix}$$

Equation (4)

where $G_1(z), \ldots, G_N(z)$ are the designed synthesis filters, superscript T denotes conjugate transposition, $\hat{S}(z)$ represents the signals after parallel reconstruction, and the aliasing-component matrix is $$F_a(z) = \begin{pmatrix} F_0(z) & F_0(zW) & \ldots & F_0(zW^{M-1}) \\ F_1(z) & F_1(zW) & \ldots & F_1(zW^{M-1}) \\ \vdots & \vdots & \ddots & \vdots \\ F_N(z) & F_N(zW) & \ldots & F_N(zW^{M-1}) \end{pmatrix}$$

Equation (5)

In an embodiment, the image S(z) is substantially free of aliasing and amplitude distortion. To obtain $\hat{S}(z)$ free of aliasing, both spatial filter bank 210 and synthesis filter bank 240 should satisfy $$G(z)^T F_a(z) = (C(z) 0 \ldots 0),$$ Equation (6)

where C(z) is an arbitrary filter function. However Equation (6) ensures only that there is no aliasing in the final signal, but does not guarantee absence of amplitude distortion in $\hat{S}(z)$. The condition for an image which is fee of both aliasing and amplitude distortion is $$G(z)^T F_a(z) = (z^{-d} 0 \ldots 0),$$ Equation (7)

where $z^{-d}$ is an arbitrary delay.

The above equation can be realized by derivation of a synthetic filter bank 240 based on the aliasing component matrix, $$G(z)^T = (z^{-d} 0 \ldots 0) F_a^{-1}(z)$$ Equation (8)

However if there are any poles in $F_a^{-1}(z),$ the reconstruction system may not be stable.

To guarantee a stable perfect reconstruction (as used herein "perfect reconstruction" refers to the condition where the signals after reconstruction have the same amplitudes and phase as the original signal with only a time delay), an intermediate filter bank V(z) (not shown) can be inserted between the decimated gradient phase-encoding block 220 and the interpolation block 230 for stabilizing the reconstruction. Thus Equation (3) becomes $$S''(z) = \frac{1}{M} V(z^M) \sum_{m=0}^{M-1} S'(zW''') = \frac{1}{M} V(z^M) \sum_{m=0}^{M-1} F(zW''') S(zW''')$$

Equation (9)

From Equation (4), (5) and (6), the perfect reconstruction condition will be $$G(z)^T V(z^M) F_a(z) = (z^{-s} 0 \ldots 0)$$ Equation (10)

Therefore the synthetic filter bank 240 is represented by:

$$G(z)^T = (z^{-d} 0 \ldots 0) F_a^{-1}(z) V^{-1}(z^M)$$ Equation (11)

where V(z) can be designed to keep G(z) stable.

In many cases of parallel MRI, especially for arrays containing a large number of detector elements, the sensitivity profiles of the array are overlapping. In such cases G(z) can be derived much more easily from the lapped transform. The manner in which lapped transforms may be used for deriving G(z) is described below with reference to FIG. 3.

Figure 3:
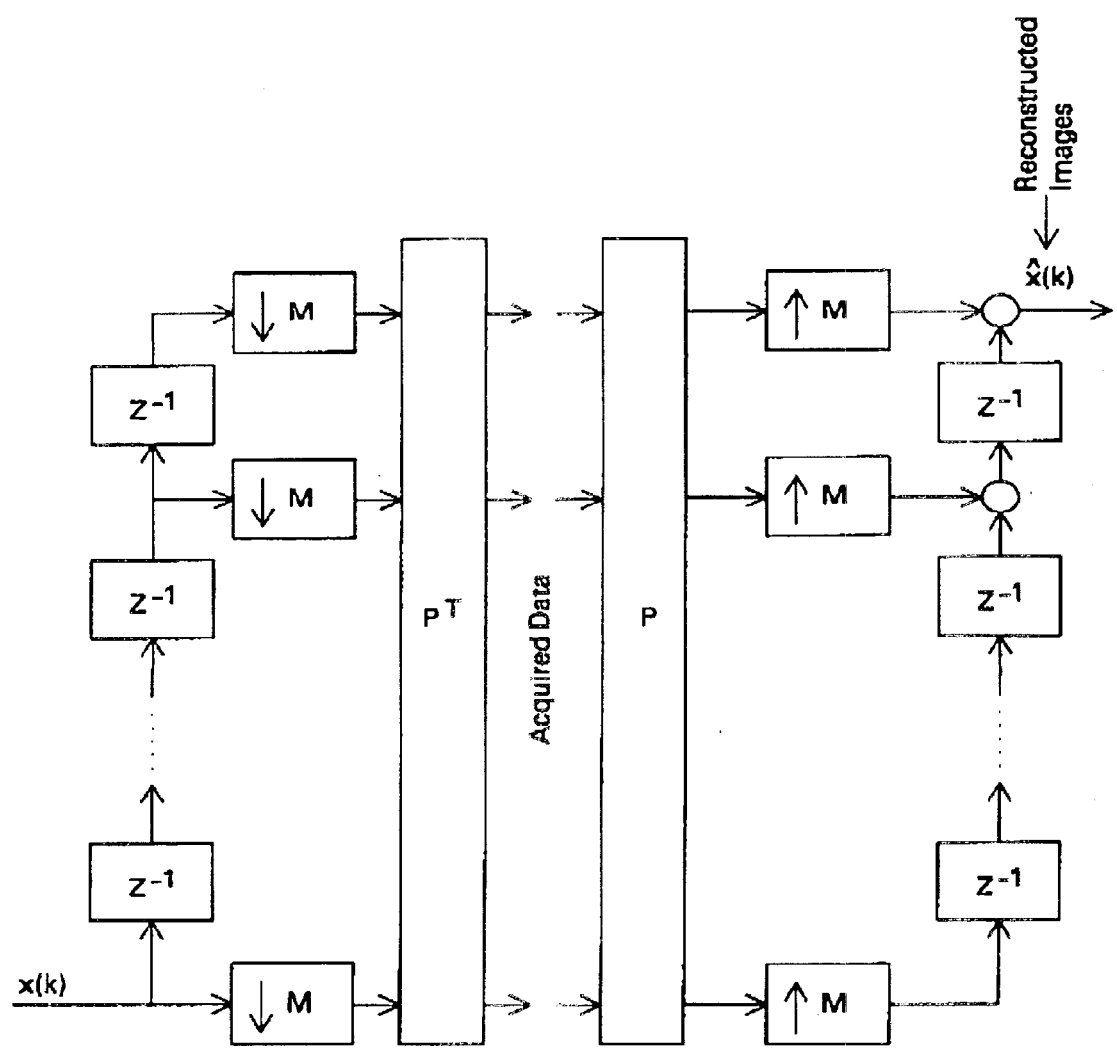
FIG. 3 is an exemplary embodiment of a lapped transform filter bank used for reconstruction of images when the sensitivity profiles of the array elements overlap.

The lapped transform is a filter bank in which the impulse responses of the synthesis filters are the LT basis functions, and the impulse responses of the spatial filters are the time-reversed basis functions. FIG. 3 is an exemplary embodiment of a lapped transform filter bank.

In FIG. 3, P is represented by $$P = \begin{pmatrix} P_1 & & & \\ & P_0 & & \\ & & \ddots & \\ & & & P_0 \\ & & & & P_2 \end{pmatrix}$$

Equation (12)

$P_0$ is a L×M matrix. L=DM, and D is the overlap factor. In $P_1$ and $P_2$, L=(D−1)M. The relation between input and output signals is given by $$\hat{x}(k) = PP^T x(k)$$ Equation (13)

The superscript T denotes complex-conjugate transposition. The perfect reconstruction condition for the lapped transform from Equation (13) is:

$$PP^T = I$$ Equation (14)

Equation (14) implies that the basis functions of P0 (the columns of P0) not only must be orthogonal to one another, $$P_0 P_0^T = I$$ Equation (15)

but also must be orthogonal to the overlapping portion of the basis functions from neighboring blocks, $$P_0 \omega P_0^T = 0,$$ Equation (16)

where the one-block shift matrix is $$\omega = \begin{pmatrix} 0 & I \\ 0 & 0 \end{pmatrix}$$ Equation (17)

and the identity matrix I is of order (D−1)M.

In a further embodiment, the detector elements of the array (RF coil assembly 147 of FIG. 1) comprise linear strips. Such an embodiment is referred to hereinafter as SAFARI or Strip Array For Analytic Reconstruction of Images. As used herein, a strip array refers to a coil array in which the conductive elements are microstrips of conductive (e.g. copper) material of a selected length connected to a ground plane and arranged to form a planar or cylindrical shape. In general, there are 8 or 16 strips, but it is to be appreciated that variations known to one skilled in the art could also be employed.

Figure 4:
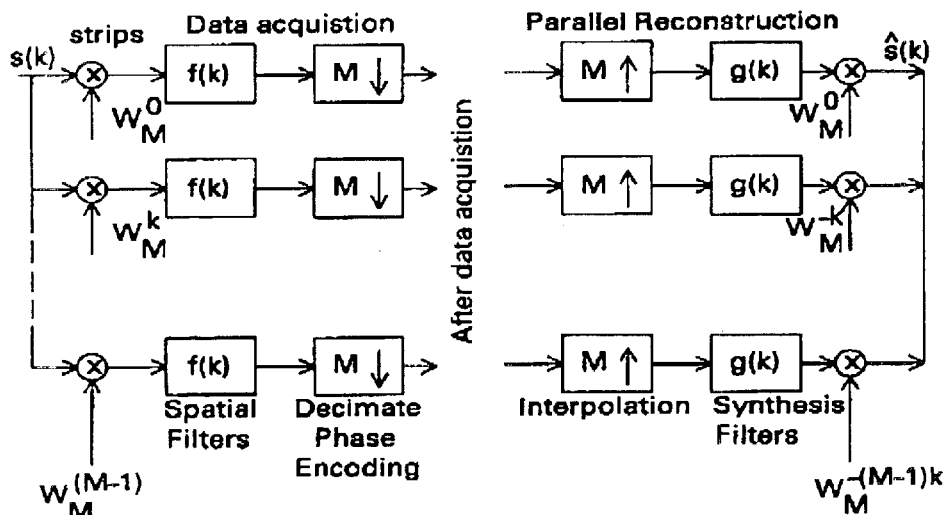
FIG. 4 is a schematic block diagram of an exemplary embodiment for a strip array.

Inherent with strip arrays, the signal from each strip introduces a different frequency modulation, as shown in FIG. 4. The mathematical representation of FIG. 4 is illustrated in FIG. 5.

Figure 5:
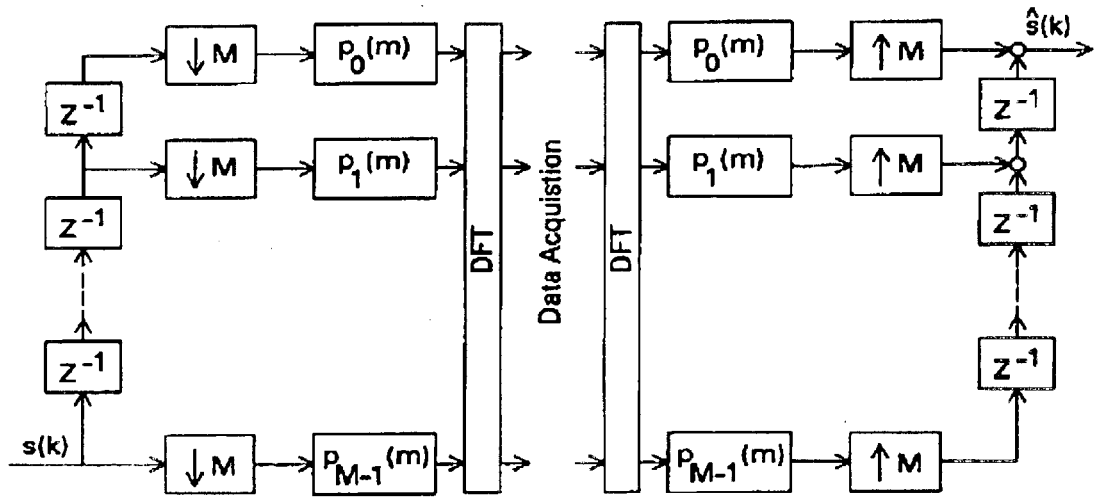
FIG. 5 is a block diagram of a mathematical equivalent of the embodiment shown in FIG. 4; and, FIG. 6 is an exemplary block diagram of a reconstruction for the embodiments shown in FIGS. 4 and 5.

From FIG. 5, it is seen that:

$$P_i(m) = f(mM+i)$$

$$q_i(m) = g(mM+i).  \quad \text{Equation (18)}$$

Where p(m), and q(m) represent mathematical equivalents for spatial filter bank f (mM+I) and synthesis filter bank g(mM+I), respectively. Here i+0, 1, . . . , M−1.

Figure 6:
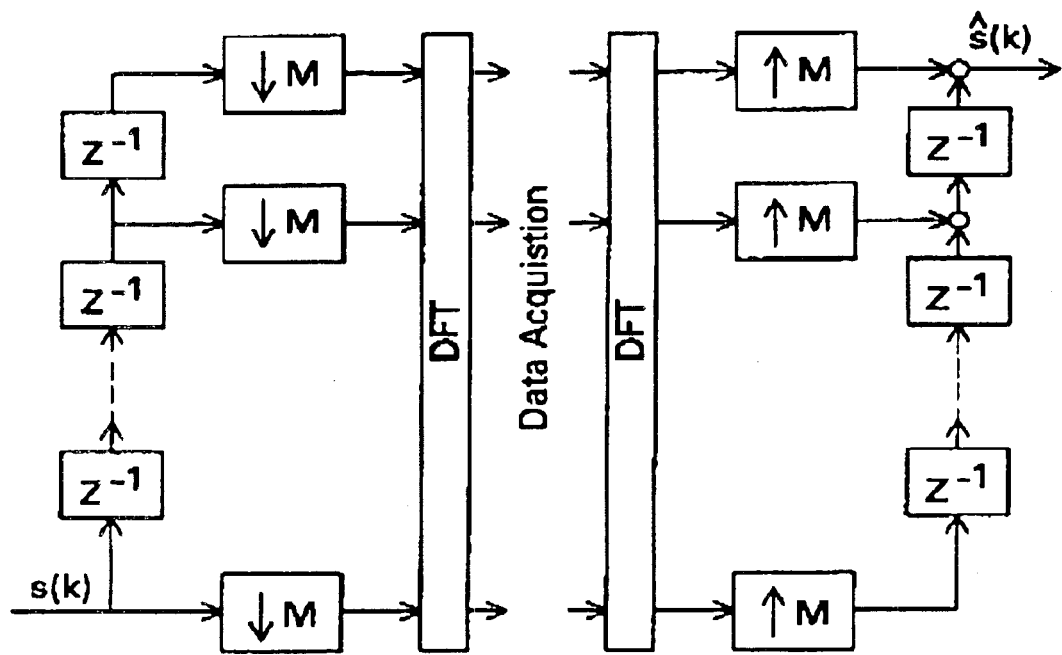

When a large number of strips are concentrated in a region that is relatively small compared to the sensitivity profiles, FIG. 5 can be simplified to FIG. 6, where the parallel reconstruction is simply a block-in From FIG. 5, it is seen that:verse discrete Fourier transform (DFT).

When the RF coil assembly is a strip array, each strip has an explicit phase relationship relative to a spatial location within the object being imaged. Referring to FIG. 4, the relationship is expressed as $W^k_M = \exp(j2\pi k/M)$ for M=0 to (M−1), where M is the number of strips in the array. Referring to FIGS. 4–6, the explicit phase relationship in the sensitivity profiles can be used for simplifying the lapped transform reconstruction described earlier.

In further embodiments of the present invention, reconstruction may be improved by adjusting the sensitivity profiles of the coils of the RF detector array (RF coil assembly 147 of FIG. 1) to realize an orthogonal sensitivity profile. Orthogonality is useful for reducing the matrix condition number, thereby making the reconstruction more robust. In a first embodiment, the RF detector array is a planar strip array comprised of multiple conductive strips and coupling capacitors interconnecting the strips. By adjustment of the interconnecting capacitors and input ports for each respective strip, the desired sensitivity profile can be obtained. In a second embodiment for adjusting sensitivity profiles, post processing can be used to improve orthogonality.

While only certain features of the invention have been illustrated and described herein, many modifications and changes will occur to those skilled in the art. It is therefore to be understood that the appended claims are intended to cover all such modifications and changes as fall within the true spirit of the invention.

What is claimed is:

1. A method for reconstruction for use in a parallel MRI system wherein a plurality of MR detector coils are arranged in an array and each coil has a corresponding spatial sensitivity profile, the method comprising:

detecting a plurality of gradient-encoded MR signals from the plurality of MR detector coils;

processing the detected MR signals with at least one filter bank to reconstruct at least one image; and an intermediate filtering step of applying an intermediate filter bank between the decimated gradient encoding and interpolating steps for stabilizing the processing step or reconstructing the at least one image.

2. The method of claim 1 wherein the plurality of MR detector coils comprises a spatial filter bank formed with the respective sensitivity profiles for spatially filtering the plurality of detected MR signals.

3. The method of claim 2 wherein the detector coils are arranged to optimize the spatial encoding of the spatial filter bank.

4. The method of claim 1 wherein the detecting stop involves collecting a decimated plurality of gradient-encoded MR signals to generate a plurality of decimated signals, and the processing step comprises the steps of:

interpolating the plurality of decimated signals to generate a plurality of interpolated signals; and, applying at least one of a tapped transform and a synthesis filter bank to reconstruct interpolated signals.

5. The method of claim 4 wherein the decimated gradient encoding consists of reduced phase encoding steps, resulting in fewer lines of k space.

6. The method of claim 1 wherein the at least one image is substantially free of aliasing and amplitude distortion.

7. The method of claim 1 wherein the sensitivity profiles of the array are overlapping and further comprising the step of applying a lapped transform to the detected signals during the processing step.

8. The method of claim 1 wherein the array is a strip array comprised of a plurality of array elements each element being a linear strip.

9. The method of claim 1 wherein the array comprises a strip array of a plurality of conductive strips, each strip having a corresponding phase relationship to a spatial location within an object to be imaged in the MRI system and the processing stop comprises encoding each of the corresponding phases to reconstruct the at least one image.

10. A method for reconstruction for use in a parallel MRI system wherein a plurality of MR detector coils are arranged in an array and each coil has a corresponding spatial sensitivity profile, the method comprising:

detecting a plurality of gradient-encoded MR signals from the plurality of MR detector coils;

processing the detected MR signals with at least one filter bank to reconstruct at least one image; and wherein the filter bank and the intermediate filter bank satisfies an equation in accordance with $G(z)_T = (z^{-d} 0 \ldots 0) F_a^{-1}(z) V^{-1}(z^M)$, wherein G(z) represents a synthesis filter bank $F_a(z)$ is an aliasing component matrix of the sensitivity profiles F, z–d is a time delay, V is an additional filter bank inserted between the decimation stage and the interpolation stage for stability and M is a decimation factor.

11. A parallel Magnetic Resonance Imaging (MRI) system comprising:

an array of magnetic resonance (MR) detector coils arranged in an array for detecting a plurality of MR signals, each of the coils having a corresponding spatial sensitivity profile;

a processing means for processing the plurality of MR signals with at least one filter bank to reconstruct at least one image;

an intermediate filter coupled between the decimated gradient encoding and the interpolating system, the intermediate filter stabilizing the processing means for reconstructing the at least one image.

12. The parallel MRI system of claim 11 wherein the array of MR detector coils comprises a spatial filter bank formed with the respective sensitivity profiles for spatially filtering the plurality of detected MR signals.

13. The parallel MRI system of claim 12 wherein the detector coils are arranged to optimize the spatial encoding of the spatial filter bank.

14. The parallel MRI system of claim 11, further comprising a decimated gradient encoding system to generate a plurality of the decimated MR signals; and, an interpolating system for interpolating the plurality of decimated signals to generate a plurality of interpolated signals; and at least one of a lapped transform and a synthesis filter bank to reconstruct interpolated signals.

15. The parallel MRI system of claim 14 wherein the decimated gradient encoding system comprises reduced phase encoding steps.

16. The parallel MRI system of claim 11 wherein the at least one image is substantially tree of aliasing and amplitude distortion.

17. The parallel MRI system of claim 11 wherein the sensitivity profiles of the array are overlapping and further comprising the step of applying a lapped transform to the detected signals during the processing step.

18. The parallel MRI system of claim 11 wherein the array comprises a strip array of a plurality of conductive strips, each strip having a corresponding phase relationship to a spatial location within an object to be imaged in the MRI system and the processing step comprises encoding each of the corresponding phases to reconstruct the at least one image.

19. A parallel Magnetic Resonance Imaging (MRI) system comprising:

an array of magnetic resonance (MRI) detector coils arranged in an array for detecting a plurality of MR signals, each of the coils having a corresponding spatial sensitivity profile;

a processing means for processing the plurality of MR signals with at least one filter bank to reconstruct at least one image; wherein the filter bank and the intermediate filter bank satisfies an equation in accordance with $G(z)^T=(z^{-d}0 \ldots 0)F_a^{-1}(z)V^{-1}(z_M)$, wherein $G(z)$ represents a synthesis filter bank, $F_a(z)$ is an aliasing component matrix of the sensitivity profiles F, z–d is a time delay, V is an additional filter bank inserted between the decimation stage and the interpolation stage for stability and M is a decimation factor.

* * * * *